United States Patent [19]

Mizuno et al.

[11] 4,287,290
[45] Sep. 1, 1981

[54] PROCESS FOR PRODUCING POLYMERIC IMAGE BY DIFFUSION STEP

[75] Inventors: Masayoshi Mizuno, Mishima; Hiroyuki Tsuchiya, Fuji, both of Japan

[73] Assignee: Asahi Kasei Kogyo Kabushiki Kaisha, Osaka, Japan

[21] Appl. No.: 135,842

[22] Filed: Mar. 31, 1980

[30] Foreign Application Priority Data

Apr. 5, 1979 [JP] Japan ................... 54-41342

[51] Int. Cl.$^3$ .................. G03C 5/54; G03C 5/00
[52] U.S. Cl. .................. 430/205; 430/204; 430/306; 430/323; 430/325; 430/202
[58] Field of Search ............ 430/205, 306, 323, 325, 430/322, 202, 204

[56] References Cited

U.S. PATENT DOCUMENTS

| | | | |
|---|---|---|---|
| 3,019,104 | 1/1962 | Oster | 430/247 |
| 3,029,145 | 4/1962 | Dumers | 430/324 |
| 3,194,661 | 7/1965 | Cohen et al. | 430/202 |
| 3,241,962 | 3/1966 | Sincius | 430/232 |
| 3,345,164 | 10/1967 | Cohen et al. | 430/247 |
| 3,451,815 | 6/1969 | Morse | 430/202 |
| 3,816,127 | 6/1974 | Haas | 430/202 |

FOREIGN PATENT DOCUMENTS 51-94814  8/1976  Japan .
53-149402 12/1978 Japan .

OTHER PUBLICATIONS

Nature, vol. 180, No. 4597, 1957, p. 1275.

Primary Examiner—Edward C. Kimlin
Attorney, Agent, or Firm—Sprung, Felfe, Horn, Lynch & Kramer

[57] ABSTRACT

A novel process for producing a polymeric image, which comprises the steps of:

(1) treating an image-wise light-exposed layer of a photographic silver halide emulsion with a treating solution having a reducing capacity, said treating solution having a capacity for initiating the polymerization of an addition-polymerizable unsaturated compound and a capacity for reducing the silver halide into metallic silver and having a property that it loses said capacity for initiating the polymerization once it is used for the reduction of the silver halide;

(2) transferring or diffusing said treating solution from the silver halide emulsion layer into a layer of an addition-polymerizable material, providing polymerized portions and unpolymerized portions; and (3) removing the unpolymerized portions.

The process of the present invention is positive working and useful for the production of printing plates, stencils, photoreliefs and photoresists for photoetchings and photofabrications, especially for the production of lithographic printing plates. The present invention also provides a novel photosensitive element comprising a support, a layer of an addition-polymerizable material formed thereon and a layer of a photographic silver halide emulsion.

11 Claims, No Drawings

PROCESS FOR PRODUCING POLYMERIC IMAGE BY DIFFUSION STEP

The present invention relates to a novel process for producing an image and a photosensitive element therefor. More particularly, the present invention relates to a process for producing a polymeric photographic image useful in the production of printing plates, stencils, photoreliefs, photoetchings and photofabrications and a photosensitive element that can advantageously be used for the process.

There have heretofore been proposed a wide variety of processes for producing an image in which a layer of an addition-polymerizable unsaturated compound is selectively photopolymerized. In these processes, a photosensitive material comprising a photopolymerizable composition is exposed through an imaging mask to actinic radiation to photopolymerize the composition in the areas exposed to the actinic radiation and an image is developed by utilizing a difference, between the photopolymerized portions and the non-photopolymerized portions of the composition, in property such as solubility in a solvent, kind of phase (i.e. solid or liquid) or adhesion to a substrate.

The photopolymerizable organic material-based compositions used in these processes comprise, as essential components, an addition-polymerizable unsaturated compound and a photopolymerization initiator and, as optional components, a binder, a filler, a heat-polymerization inhibitor, a stabilizer, a colorant and the like. For practical use as a photosensitive material, the compositions are usually provided in the form of a layer carried by a suitable substrate. The mechanical strength, chemicals resistance, thermal characteristics, electrical characteristics and the like of a polymeric image produced from a photopolymerizable composition can be varied to desired levels by appropriately choosing the components of the composition such as an addition-polymerizable unsaturated compound, a binder and a filler. Therefore, the photopolymerizable compositions are widely used in various field. For example, they are used not only for the production of printing plates such as lithographic printing plates and letterpress printing plates, but also for the production of high precision photoreliefs and photoresists for photoetchings and photofabrications. They are also used as photocopying materials.

The photosensitive materials prepared from the abovementioned photopolymerizable compositions, however, have low photosensitivity like those prepared from other organic material-based photosensitive compositions such as compositions comprising an organic colloidal substance, such as gelatin or polyvinyl alcohol, and a dichromate or a diazonium salt, compositions comprising a phenolic resin and a diazonium salt, compositions comprising cyclized rubber and an azido compound, and compositions comprising a cinnamic acid derivative. Therefore, the photosensitive materials prepared from the photopolymerizable compositions are required, for the formation of an image, to be irradiated with a considerably large amount of radiation energy in the step of exposure to actinic radiation. Accordingly, the photosensitive materials prepared from the photopolymerizable compositions can hardly be practically utilized in the case where the photosensitive materials are to be exposed through an optical element such as a lens to light reflecting from a manuscript or light subjected to enlarged projection. On the other hand, a photosensitive material comprising a photographic silver halide emulsion and an electrostatic photographic material comprising a photosensitive semiconductor (photosemiconductor) have such high photosensitivity that images can be formed by irradiation of the materials with a small amount of light energy. However, they are used in most cases for usual photography or copying and only in a very few cases for the production of printing plates because the kinds of raw materials employable therein are much limited.

For solving the problems that the above-mentioned organic material-based photosensitive compositions are low in photosensitivity and that the above-mentioned photosensitive materials comprising a silver halide emulsion and the electrostatic photographic materials comprising a photosensitive semiconductor are limited in their application fields, there have been proposed processes of producing an image by using a combination of a photographic silver halide emulsion and an addition-polymerizable composition, for example, a process comprising treating, with a combined treating agent of a solubilization agent for a silver halide, such as a thiosulfate, and a peroxide, such as a persulfate, a photographic silver halide emulsion layer which has been imagewise exposed to light and subjected to development treatment but has not yet been subjected to fixing treatment, and contacting the silver halide emulsion layer with a layer of an addition-polymerizable composition to form an image thereon (Japanese Patent Publication No. 2657/1964). In this process, the silver ions which are present in the form of the silver halide in the light-unexposed portions of the photographic silver halide emulsion layer subjected to light exposure and development treatment are solubilized with the solubilization agent for the silver halide, and the solubilized silver ions and the peroxide were transferred into the addition-polymerizable composition layer which is then subjected to an addition-polymerization reaction with the aid of free radicals produced by the reaction between the silver ions and the peroxide to form a polymeric image corresponding to the light-unexposed portions of the photographic emulsion layer. In Japanese Patent Publication No. 18862/1966, there is disclosed another process comprising subjecting a photographic silver halide emulsion layer to light exposure, development and fixation according to the customary process to form a silver image, oxidizing the metallic silver in the silver-imaged portions of the emulsion layer with a combined treating agent of an oxidation catalyst and a peroxide to form silver ions, and transferring the silver ions and the peroxide into a layer of addition-polymerizable composition which is then polymerized with the aid of the free radicals formed by the reaction between the silver ions and the peroxide to form a polymeric image corresponding to the light-exposed and silver-imaged portions of the emulsion layer as opposed to the process disclosed in Japanese Patent Publication No. 2657/1964.

In both of these processes, the silver ions ($Ag^+$) are transferred from the silver halide emulsion layer to the addition-polymerizable composition layer, and the addition-polymerization reaction is initiated by the free radicals which have been formed by the reaction of the silver ions with the peroxide. Accordingly, the silver halide emulsion layer which has been subjected to light exposure and development and, in the case of the process of Japanese Patent Publication No. 18862/1966, fixation to form a silver image must be treated with another treating agent after removal of the developing solution and any fixing solution from the emulsion layer, thereby to impart to the emulsion layer an ability to initiate the addition-polymerization reaction of the layer of the addition-polymerizable composition when the emulsion layer is contacted therewith.

There is also known a process in which a silver salt is, at the beginning, incorporated as a photopolymerization initiator into a photopolymerizable composition. However, the resulting photopolymerizable composition is not so improved in photosensitivity as compared with photopolymerizable compositions containing a common photopolymerization initiator. Further, it is reported in "Nature", vol. 180, page 1275, (1957) that semiquinone formed in the course of the development of a silver halide photographic emulsion will function as a polymerization initiator. However, since the life cycle of the semiquinone produced during development is of short duration, a polymerizable monomer must be present in the system of the emulsion containing a medium such as gelatin at the time of development. Therefore, the polymerization of the polymerizable monomer with the aid of the semiquinone cannot form a practically useful polymeric image such as intended in the present invention.

Further, there is proposed in Japanese Patent Application Laid-Open Specification No. 94819/1976 a process in which a photosensitive composition comprising a silver halide and a polycondensate having phenolic nuclei is image-wise exposed to light and treated with a developing solution containing an aromatic amine for reducing the silver halide to form an oxide of the aromatic amine only in the exposed portions of the composition wherein coupling occurs between the oxide of the aromatic amine and the polycondensate having phenolic nuclei to provide insolubilized portions corresponding to the exposed portions in the composition. Similarly, there is proposed in Japanese Patent Application Laid-Open Specification No. 149402/1978 a process in which a photosensitive composition comprising a silver halide and an epoxy resin is image-wise exposed to light and treated with a developing solution containing an aromatic amine to form an oxide of the aromatic amine in the exposed portions of the composition, and the composition is heated up to harden the epoxy resin with the aromatic amine remaining in the unexposed portions of the composition which are insolubilized upon hardening of the epoxy resin. However, in practicing these image-producing processes, a considerable difficulty is encountered in establishing an appropriate proportion of the amount of the developing solution to be used relatively to the amount of the silver halide for securing a sufficient but not excessive amount of the oxide of the aromatic amine or the remaining aromatic amine to insolubilize the photosensitive composition in the portions where an image is to be formed.

Accordingly, an important problem to be solved in this technical field has been to provide an image-producing process which can be practiced with a high photosensitivity and with ease in handling materials used therein and which can form a polymeric image excellent in various characteristics.

With a view to solving the above-mentioned problem, the present inventors have made extensive and intensive studies and found that a specific reducing solution which is used as a developing solution for a common silver halide emulsion can function as a polymerization initiator for an addition-polymerizable unsaturated compound and that the function of the reducing solution as the polymerization initiator is lost after the reducing solution has been used for the reduction of the silver halide. The present invention has been completed based on such novel findings.

More specifically, in accordance with the present invention, there is provided a process for producing a polymeric image by selectively polymerizing a layer of an addition-polymerizable material comprising at least one addition-polymerizable unsaturated compound only in predetermined portions of the layer to provide polymerized portions and unpolymerized portions and removing the unpolymerized portions of the layer, which process comprises the steps of:

(1) treating an image-wise light-exposed layer of a photographic silver halide emulsion with a treating solution having a reducing capacity, said treating solution having a capacity for initiating the polymerization of an additio-polymerizable unsaturated compound and a capacity for reducing the silver halide contained in the silver halide emulsion layer into metallic silver and having a property that it loses said capacity for initiating the polymerization of the addition-polymerizable unsaturated compound once it is used for the reduction of the silver halide;

(2) transferring or diffusing said treating solution from the silver halide emulsion layer into a layer of an addition-polymerizable material comprising at least one addition-polymerizable unsaturated compound to polymerize the addition-polymerizable material layer selectively in its portions corresponding to the light-exposed portions of the silver halide emulsion layer in which the treating solution remains unreacted through the step (1), providing polymerized portions and unpolymerized portions; and (3) removing the unpolymerized portions.

For practicing the process of the present invention, it is advantageous to use an image forming photosensitive element comprising a sheet support, a layer thereon of an addition-polymerizable material comprising at least one addition-polymerizable unsaturated compound and a layer thereon of a photographic silver halide emulsion. The photosensitive element is exposed through an imaging mask to light, and subjected to developing treatment with a treating solution having a reducing capacity. During the course of the developing treatment, the silver halide emulsion layer is subjected in the light-exposed portions to a reduction reaction through which the treating solution loses a polymerization-initiating capacity, while the lightunexposed portions of the silver halide emulsion layer do not undergo the reduction reaction. The treating solution remaining intact in the light-unexposed portions of the silver halide emulsion layer and still having a polymerization-initiating capacity is diffused through the silver halide emulsion layer into the addition-polymerizable material layer, whereupon the selective polymerization of the polymerizable material layer in its portions corresponding to the unexposed portions of the emulsion layer is initiated by the action of the diffused treating solution to form a polymeric image in the material layer. Alternatively, the photographic silver halide emulsion layer and the addition-polymerizable material layer may be provided in two separate units each comprising a sheet support. In this case, the unit having the silver halide emulsion layer is image-wise exposed to light and treated with the treating solution having a reducing capacity. The emulsion layer of the unit thus treated is closely contacted with the polymerizable material layer of the other unit, thereby to transfer or diffuse the treating solution into the polymerizable materal layer.

A treating solution having a reducing capacity to be used in the process of the present invention is chosen from developing solutions commonly used for conventional photographic silver halide emulsions. For example, an aqueous solution containing as essential ingredients a developing agent capable of exhibiting a reducing ability in an aqueous alkaline solution, an alkali and an anti-oxidizing agent may be used as the treating solution. As described above, the treating solution is required to function not only as a developer for a photographic silver halide emulsion but also as a polymerization initiator for an addition-polymerizable unsaturated compound and not to function as the polymerization initiator once it is used for the reduction of the silver halide.

Whether or not a given treating solution having a reducing capacity has such required properties as mentioned above can be easily confirmed, for example, by the following simple combination of tests. The treating solution is contacted with a layer of a polymerizable material containing an addition-polymerizable unsaturated compound as a main component which layer has been provided on an appropriate substrate, said layer being optionally dried by heating. The material layer is examined by an appropriate method to determine whether or not it has already been polymerized or hardened. Whether or not the treating solution having a polymerization-initiating capacity which has been confirmed in such a manner as described above will lose the polymerization-initiating capcity once it is used for the reduction of the silver halide in the photographic silver halide emulsion is confirmed by adding crystals of the silver halide into a certain amount of the treating solution and examining the polymerization-initiating capacity of the resulting treating solution in the same manner as described above. Upon the addition of the crystals of the silver halide into the treating solution, the silver halide is reduced to metallic silver as is shown in the followig equation:

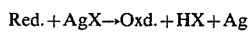

$$Red. + AgX \rightarrow Oxd. + HX + Ag$$

wherein Red. represents a developing agent, Oxd. represents an oxidation product of the developing agent and X represents a halogen atom.

In this test, it is desired that small crystals of the silver halide be added to the treating solution with sufficient agitation. If large crystals of the silver halide is used or if the agitation of the treating solution is insufficient, the reduction reaction may proceed so locally that the confirmation may give an uncertain result. Treating solutions having a reducing capacity which function as the polymerization initiator in the former test and do not function as the polymerization initiator in the latter test can advantageously be used in the process of the present invention.

In the process of the present invention, treating solutions having a reducing capacity to be used are those having a property that they will not function at all as the polymerization initiator once the silver halide is added thereinto in the stoichiometric amount, preferably in an amount even less than the stoichiometric amount of the silver halide to be reacted with the developing agents of the treating solutions in the oxidation-reduction reaction as expressed in the aforementioned equation. An example of the developing agent which is useful for the formulation of treating solutions having such a property is hydroquinone which may usually be used at a concentration of 0.1 to 10% by weight in treating solutions having a reducing capacity. Other examples of the developing agent include o-, m- or p-aminophenol, 2,4-diaminophenol dihydrochloride (amidol), p-phenylendiamine, L-ascorbic acid and catechol, which also are preferably used at a concentration of 0.1 to 10% by weight in treating solutions. However, hydroquinone is most preferred. The above-mentioned developing agents may be used either alone or in combination.

Those alkalis such as NaOH, $Na_2CO_3$, $NA_3PO_4$, $NaBO_2.4H_2O$ and $Na_2B_2O_7.10H_2O$ can be used as a development promotor in a treating solution having a reducing capacity. If desired, a buffering agent such as $Na_3PO_4$—$Na_2HPO_4$, $Na_2CO_3$—$NaHCO_3$, $Na_2B_4O_7$—$NaOH$ or $Na_2B_4O_7$—$H_3PO_3$ may be used for buffering the alkalinity of a treating solution which is given by the alkali used. An alkali is preferably used in such an amount as will provide a pH value of a treating solution of 8 or more.

Since the aforementioned developing agent is liable to be oxidized in an alkaline solution thereof with oxygen being dissolved into said solution from the ambient air so that the function of the developing agent may be lost during storage, an anti-oxidizing agent advantageously is used as a preservative in combination with the developing agent. As such an anti-oxidizing agent, there can be mentioned, for example, sulfites, hydrogensulfites and metasulfites which are salts of alkali metals such as potassium and sodium. The anti-oxidizing agent may usually be used at a concentration of 0.01 to 20% by weight in treating solutions having a reducing capacity.

A sulfite reacts with formaldehyde in an aqueous solution containing them to form an alkali as is shown in the following equation.

$$SO_3^{--} + HCHO + H_2O \rightleftharpoons HCHO.HSO_3^- + OH^-$$

A formaldehyde-bisulfite ($HCHO.HSO_3^-$) simultaneously formed in the aqueous solution is dissociated into sulfite ions to such a slight extent that the sulfite concentration in the aqueous solution can be maintained at a constant level. Therefore, a combination of a sulfite and formaldehyde can play both roles of the development promotor and the preservative. A formaldehyde-bisulfite alone, if used, can also play the same roles as mentioned above.

In the process of the present invention, it is very advantageous to allow a formaldehyde-bisulfite to be present in a treating solution having a reducing capacity. For this purpose, a combination of a sulfite and an aqueous solution of formaldehyde such as formalin or a combination of sodium formaldehyde-bisulfite and an alakali such as NaOH may be used in the treating solution. In this case, it is preferred that the formaldehyde-bisulfite concentration in the treating solution be in the range of from 0.1 to 20% by weight.

An anti-foggant may be used in an treating solution having a reducing capacity to be used in the process of the present invention. As such an anti-foggant, there can be mentioned, for example, those commonly used in developing solutions for conventional photographic silver halide emulsions, such as alkali metal halides, e.g., KBr, KI, KCl and NcCl, benzotriazole, and 6-nitrobenzimidazole.

As described hereinbefore, various combinations of developing agent, alkali, anti-oxidizing agent and the like are conceivable for use in a treating solution having a reducing capacity to be used in the process of the present invention. However, most preferable and useful are aqueous solutions containing hydroquinone and a formaldehyde-bisulfite and having a pH value of 8 or more.

The mechanism according to which a treating solution having a reducing capacity to be used in the process of the present invention initiates the polymerization of an addition-polymerizable unsaturated compound has not been elucidated yet. It is believed that the developing agent, the alkali and the anti-oxidizing agent used as the components of the treating solution react complicatedly to initiate the radical or ionic polymerization of the addition-polymerizable unsaturated compound. It has never been disclosed that the treating solution which is commonly used as the usual developing solution for photographic silver halide emulsions has a polymerization-initiating capacity and will lose said capacity after it is used for the reduction of the photographic silver halide emulsion. Accordingly, the image-producing process of the present invention which utilizes such peculiar properties of the developing solution is quite novel.

The photographic silver halide emulsion may be coated directly on a support and dried to form one unit to be used in the aforementioned embodiment of the present invention wherein two separate units are used. Alternatively, the photographic silver halide emulsion may be coated on an addition-polymerizable material layer provided on a support and dried to form a photosensitive material to be used in another embodiment of the present invention as described hereinbefore. Silver iodide, silver bromide and silver chloride may be used, in the form of fine crystals, either alone or in combination in the photographic silver halide emulsion. The silver halide is uniformly dispersed in a medium or binder such as gelatin and the resulting emulsion is formed into a layer in the manner as described above. The silver halide may be prepared in a solution of gelatin according to a known method, for example, a method in which the double decomposition reaction between silver nitrate and a water-soluble halide such as a sodium halide, a potassium halide or an ammonium halide is utilized. If desired, various kinds of additives may be added to the photographic silver halide emulsion. Examples of such additives include chemical sensitizers such as thiosulfates, stannous chloride, sulfites and gold compounds; sensitizing dyes such as cyanine type dyes and merocyanine type dyes; gradation modifiers such as rhodium compounds, iridium compounds, cadmium compounds and lead compounds; anti-foggants as metnioned before; hardeners for gelatin such as aldehyde compounds and epoxy compounds; and plasticizers for gelatin. Other water-soluble macromolecular compound or polymer may be used as the dispersion medium or binder in place of or in combination with gelatin. Examples of such a water-soluble macromolecular compound or polymer include gum arabic, egg albumin, dextrin, polyvinyl alcohol, polyacrylamide, polyvinyl pyrrolidone, poyvinyl imidazole, polyacrylic acid and combinations thereof.

The thickness of the layer of the silver halide photographic emulsion is usually in the range of from $0.1\mu$ to $100\mu$.

The photographic silver halide emulsion layer formed on the support or the addition-polymerizable material layer is image-wise exposed to light to form a latent image on the exposed portions of the emulsion layer. When the thus exposed silver halide emulsion layer is treated with a treating solution having a reducing capacity (developing solution), the silver halide is reduced into metallic silver by the action of the treating solution around silver atoms constituting the latent image and acting as development centers. For example, where the developing agent used in the treating solution is hydroquinone, the following reactions occur.

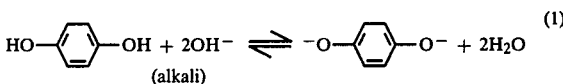

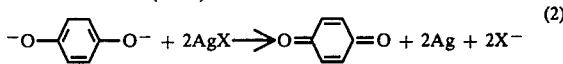

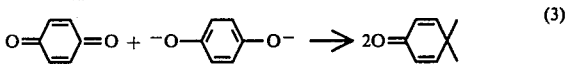

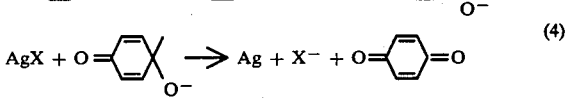

wherein X represents a halogen atom.

Semiquinone formed by the reaction as shown in the above equation (3) has a particularly strong reducing capacity which accelerates the reduction into metallic silver of the silver halide present in the exposed portions of the emulsion layer, said reduction proceeding rapidly due to the repetition of the reaction of the above equation (3) and the reaction of the above equation (4) which repetition provides infectious development. The hydroquinone used as the developing agent and the alkali are consumed with the advance of the reactions as is apparent from the above equations (1) and (2), and, simultaneously, the pH value of the treating solution is lowered by the consumption of the alkali. It is believed that, as a result of the above, the treating solution present on and in the exposed portions of the emulsion layer loses rapidly a polymerization-initiating capacity in the course of the development of the emulsion layer. In the case of a treating solution having a reducing capacity which comprises a combined system of hydroquinone and a formaldehyde-bisulfite, when the pH value of the treating solution is lowered to below 8, the polymerization-initiating capacity of the treating solution is lost. On the other hand, the treating solution present on and in the unexposed portions of the silver halide emulsion layer remains intact and retains a polymerization-initiating capacity because the unexposed portions of the emulsion layer do not have a silver latent image and, hence, the above-mentioned reactions do not proceed in the unexposed portions of the emulsion layer.

Accordingly, when the treating solution used in the development of the photographic silver halde emulsion layer is transferred or diffused from the emulsion layer into the addition-polymerizable material layer, the polymerization reaction of the addition-polymerizable material proceeds only in the portions of the material layer corresponding to the unexposed portions of the silver halide emulsion layer, thus leading to the selective polymerization of the polymerizable material layer corresponding to the desired image.

The treatment of the photographic silver halide emulsion layer with the treating solution having a reducing agent may be done by dipping the silver halide emulsion layer carried either directly or through the addition-polymerizable material layer on a support in the treating solution or by coating the treating solution on the silver halide emulsion layer. The development reaction is allowed to proceed for a predetermined time, e.g. for 1 second to 10 minutes. If the amount of the treating solution used for the reaction with the silver halide of the silver halide emulsion layer is too large, there is a possibility that the polymerization reaction of the addition-polymerizable material layer into which the treating solution is to be transferred or diffused will proceed even in the portions of the material layer corresponding to the light-exposed portions of the emulsion layer. Therefore, care must be taken in treating the silver halide emulsion layer with the treating solution so that the silver halide emulsion layer is not supplied with an unnecessarily large amount of the treating solution. The amount of the treating solution to be used for the treatment of the photographic silver halide emulsion layer varies largely depending on the kind and amount of silver halide, the kind and developing agent content of treating solution having a reducing capacity and the like, but may usually be in the range of from 1 to 200 g per $m^2$ of the emulsion layer. That amount as specified above of the treating solution with which the silver halide emulsion layer is impregnated is involved in the step of the transferring or diffusion of the treating solution into the addition-polymerizable material layer. In practice, when the photographic silver halide emulsion layer is dipped in the treating solution, the silver halide emulsion layer is picked up from the treating solution just before the formation of a silver image on the emulsion layer begins, and the treating solution remaining on the surface of the emulsion layer is removed, for example, by means of a squeegee. Thus, only that amount of the treating solution absorbed and retained in the silver halide emulsion layer is involved in the step of the transferring or diffusion of the treating solution from the emulsion layer into the addition-polymerizable material layer. In practice, when the treating solution is coated on the photographic silver halide emulsion layer, the amount of the treating solution with which the silver halide emulsion layer is supplied does not exceed the maximum amount of the treating solution which the silver halide emulsion layer can absorb and retain therein.

The image-wise light-exposure of the photographic silver halide emulsion layer may be done either by taking on the emulsion layer a photograph of a manuscript using a camera or by contact-printing a manuscript on the emulsion layer. Either in the case where an opaque manuscript is photographed by using reflecting light therefrom or in the case where a transparent manuscript is contact-printed by using transmitted light therethrough, a final polymeric image formed on the polymerizable material layer corresponds to the non-reflected or non-transmitting portions of the manuscript. Thus, the process of the present invention is positive-working.

The present invention further provides an image forming photosensitive element of the kind as described hereinbefore in connection with the process of the present invention, which comprises a sheet support and, superimposed in the following order, a layer of an addition-polymerizable material comprising at least one addition-polymerizable unsaturated compound and a layer of a photographic silver halide emulsion. If desired, the photosensitive element of the present invention may further comprise an interlayer provided between the photographic silver halide emulsion layer and the addition-polymerizable material layer. This interlayer may serve as a diffusion-adjusting layer for a treating solution having a reducing capacity and/or an adhesive layer. Examples of a material constituting the interlayer include crosslinked polymers of the materials as mentioned above as dispersion mediums or binders of the photographic silver halide emulsion, acrylic resins, epoxy resins, urethane resins, urea resins and combinations thereof.

The unit having a photographic silver halide emulsion layer that is used in the aforementioned embodiment of the present invention wherein two separate units are used, also may further comprise an interlayer between the silver halide emulsion layer and the support according to need. This interlayer may serve as an adhesive layer. The material constituting this interlayer may be the same as mentioned above in connection with the material constituting the interlayer that may be provided in the image forming photosensitive element of the present invention as mentioned above.

As preferred supports to be used in the photosensitive element of the present invention or in the two separate units for practicing the process of the present invention, there can be mentioned, for example, films or sheets of plastics such as polyethylene terephthalate, polycarbonates, polyvinyl chloride, polypropylene, polyethylene, polyamides, cellulose acetates and cellulose nitrate; sheets of metals such as aluminum, iron, zinc, copper, magnesium and their alloys; paper; cellophane; and composite materials thereof.

The term "addition-polymerizable unsaturated compound" as used herein is intended to indicate compounds having at least one carbon-carbon double bond capable of taking an active part in the addition polymerization reaction. Examples of such compounds include those having at least one group selected from a vinyl group, a vinylidene group, a fumaroyl group and a maleoyl group. Specific examples of such compounds include unsaturated monocarboxylic acids such as acrylic acid and methacrylic acid; esters of acrylic acid or methacrylic acid having as an ester-forming group an alkyl group, a cycloalkyl group, a halogenated alkyl group, an alkoxyalkyl group, a hydroxyalkyl group, an aminoalkyl group, a tetrahydrofurfuryl group, an allyl group, a glycidyl group, a benzyl group or a phenoxy group; mono- or di-acrylates and mono- or di-methacrylates of alkylene glycols or polyoxyalkylene glycols (number average molecular weight: up to 2,000); polyacrylates and polymethacrylates such as trimethylopropane triacrylate, trimethylolpropane trimethacrylate, pentaerythritol tetraacrylate and pentaerythritol tetramethacrylate; unsaturated monocarboxylic acid amides such as acrylamide and methacrylamide; derivatives of acrylamide or methacrylamide such as N-alkyl- or N,N-dialkyl-acrylamides, N-alkyl- or N,N-dialkyl-methacrylamides, N-hydroxyalkyl- or N,N-dihydroxyalkyl-acrylamide, N-hydroxyalkyl- or N,N-dihyroxyalkyl-methacrylamides, diacetone acrylamide, diacetone methacrylamide, N,N'-alkylenebisacrylamide and N,N'-alkylenebismethacrylamide; allyl compounds such as allyl alcohol, allyl isocianate, diallyl phthalate and triallyl cyanurate; unsaturated dicarboxylic acids and acid anhydrides such as maleic acid, maleic anhydride, fumaric acid and itaconic acid; monoesters and diesters of maleic acid, fumaric acid or itaconic acid having as an ester-forming group one or two groups selected from an alkyl group, a halogenated alkyl group and an alkoxy-alkyl group; acrylates and methacrylates of epoxy group-containing compounds obtained by esterifying acrylic acid or methacrylic acid with an epoxy group-containing compound which is obtained, for example, by the dehydrochlorination reaction of a polyhydric alcohol or a polyhydric phenol with epichlorohydrin; and other unsaturated compounds such as styrene, vinyltoluene, divinylbenzene, N-vinylcarbazole, and N-vinylpyrrolidone. Various resins and polymers may also be used as the addition-polymerizable unsaturated compound. Examples of such resins and polymers include unsaturated polyesters prepared from at least one unsaturated dicarboxylic acid, such as maleic acid, fumaric acid or itaconic acid, and/or its anhydride, and at least one polyhydric alcohol such as ethylene glycol, propylene glycol, diethylene glycol, triethylene glycol, glycerin, trimethylolpropane or pentaerythritol; unsaturated polyesters prepared from at least one unsaturated dicarboxylic acid or its anhydride as mentioned above, at least one polyhydric alcohol as mentioned above, and at least one saturated dicarboxylic acid or its anhydride such as succinic acid, adipic acid, phthalic acid, isophthalic acid, phthalic anhydride, trimellitic acid or trimellitic acid anhydride; alkyd resins prepared by using at least one drying oil and/or at least one semidrying oil as a modifier for polyesters; unsaturated polyurethanes having addition-polymerizable unsaturated groups derived from at least one unsaturated mono- or di-carboxylic acid or its ester derivative or an unsaturated polyester as mentioned above and introduced thereinto by utilizing terminal isocyanate and/or hydroxyl groups of a urethane compound or polyurethane having urethane groups derived from at least one polyol having two or more hydroxyl groups and at least one polyisocyanate, for example, unsaturated polyurethanes which are prepared from (1) a polyurethane having terminal isocyanate and/or hydroxyl groups and prepared from at least one polyol such as a polyhydric alcohol as mentioned above, a polyester polyol or a polyether polyol and at least one polyisocyanate such as tolylene diisocyanate, diphenylmethane-4,4'-diisocyanate or hexamethylene diisocyanate and (2) at least one unsaturated mono- or di-carboxylic acid as mentioned above or its ester or polyester having active hydrogen atoms derived from hydroxyl (reactive with the terminal isocyanate) and/or carboxyl (reactive with both of the terminal isocyanate and the terminal hydroxyl) and/or amino groups (reactive with the terminal isocyanate), if any; polyisocyanate-modified unsaturated polyester obtained by linking two or more molecules of an unsaturated polyester as mentioned above with a polyisocyanate; polymers having, in its side chains, carbon-carbon double bonds capable of taking an active part in the addition polymerization reaction, for example, polymers obtained by reacting an unsaturated carboxylic acid or its anhydride with a polymer having hydroxyl groups such as polyvinyl alcohol or cellulose, polymers obtained by esterifying a polymer or a copolymer of acrylic acid or methacrylic acid having carboxyl groups with an unsaturated alcohol such as allyl alcohol, glycidyl acrylate or glycidyl methacrylate, a polymer obtained by reacting a copolymer containing maleic anhydride monomer units with allyl alcohol, a hydroxyalkyl acrylate and/or a hydroxy-alkyl methacrylate, and a polymers obtained by reacting a copolymer having glycidyl acrylate and/or glycidyl methacrylate monomer units with acrylic acid and/or methacrylic acid. Various oligomers may also be used as the addition-polymerizable unsaturated compound. Examples of such oligomers include oligomers of an ester-acrylate type obtained by the co-condensation of an esterification reaction system composed of a polycarboxylic acid or its anhydride and a polyhydric alcohol with acrylic acid and/or methacrylic acid and having a number average molecular weight of about 200 to about 5,000, said molecular weight being controlled by choosing an appropriate molar ratio of the raw materials, examples of said polycarboxylic acid or its anhydride being adipic acid, isophthalic acid, phthalic acid and phthalic anhydride, examples of said polyhydric alcohol being ethylene glycol, propylene glycol, diethylene glycol, triethylene glycol, glycerin, trimethylolpropane and pentaerythritol. The above-enumerated addition-polymerizable unsaturated compounds may be used either alone or in combination. In the addition-polymerizable unsaturated compounds, by the alkyl is meant a straight chain or branched aliphatic hydrocarbon group having 1 to 20 carbon atoms, by the cycloalkyl a group having 5 to 26 carbon atoms and consisting of a 5- or 6-membered alicyclic ring unsubstituted or substituted with alkyl, and by the alkylene a straight or branched hydrocarbon group having 2 to 6 carbon atoms. The number average molecular weight of a resin or polymer is desired to be up to 1,000,000, preferably 1,000 to 200,000. For the measurement of a number average molecular weight, there is adopted a gel permeation chromatography (GPC) method using, as a standard sample, a polystyrene manufactured by Pressure Chemical Co., U.S.A. and as an apparatus, WATERS 200 manufactured by Japan-Waters Co., Japan.

A layer of an addition-polymerizable material to be used in the present invention comprises at least one addition-polymerizable unsaturated compound as the essential component, and a binder, a filler and one or more additives according to need. The addition-polymerizable unsaturated compound content of the addition-polymerizable material is usually at least 5% by weight, preferably at least 20% by weight. The addition-polymerizable material layer is in a state of paste or solid under room temperature. When a liquid addition-polymerizable unsaturated compound is used, it advantageously is used in combination with other solid addition-polymerizable unsaturated compound and/or a binder and/or a filler. As examples of binders, there can be mentioned organic polymers soluble in water or an aqueous alkaline solution, such as polyvinyl alcohol, derivatives of polyvinyl alcohol, derivatives of cellulose, polyacrylic acid, polymethacrylic acid and polyacrylamide; organic polymers soluble in various kind of organic solvents, such as soluble polyamides, polystyrene, phenolic resins, polyacrylates, cellulose acetate, cellulose butyrate, cellulose acetate butyrate and cellulose nitrate. As examples of fillers, there can be mentioned inorganic materials such as carbon black, silicon dioxide, calcium carbonate, alumina, titanium dioxide, zinc oxide, barium sulfate and glass powder. The addition-polymerizable material layer may comprise a known heat-polymerization inhibitor for improving the storage stability thereof. Examples of such a heat-polymerization inhibitor include p-methoxyphenol, catechol, p-benzoquinone, 2,6-di-tert-butylcatechol, 2,5-diphenyl-p-benzoquinone and copper chloride.

A colored polymeric image may be produced according to the process of the present invention. In this case, various kinds of pigments and/or dyes can be used. In the present invention, as opposed to the conventional processes in which photopolymerizable compositions are used, it is not necessary that the polymerizable material is exposed to actinic radiation and, hence, there is, advantageously, no limitation in choosing the concentration and color of pigments and/or dyes. As the pigments and/or dyes, there can be used inorganic or organic pigments and/or dyes which are generally used for paints and/or inks. They are appropriately chosen according to the desired color and density.

The layer of the aforementioned polymerizable material may be formed by dissolving the raw polymerizable material in a suitable solvent and applying the resulting solution onto the surface of a support, followed by drying. As examples of the suitable solvent, there can be mentioned water and organic solvents such as alcohols (e.g. methanol, ethanol and isopropanol), acetic acid esters (e.g. ethyl acetate and n-butyl acetate), toluene, xylenes, hexanes, cellosolves, methyl ethyl ketone, trichloroethylene and tetrahydrofuran. As described before, as the support, there can be used films or sheets made of various kinds of plastics, metallic sheets, paper sheets and the like. As described before, a layer of an adhesive may be formed on the support prior to application of the solution of the raw polymerizable material so that the adhesive layer is formed between the support and the polymerizable material layer.

Alternatively, the raw polymerizable material as such, without being dissolved in a solvent, may be formed into a film- or sheet-shaped layer by a suitable method, for example, pressing, casting or calendering. The polymerizable layer thus formed may be attached onto a support by means of an adhesive, if desired.

The thickness of the polymerizable material layer may vary according to the intended application of the polymeric image to be formed therefrom, but may generally be in the range of from 0.0001 to 1 mm.

The polymerizable material layer thus formed can be easily polymerized by the action of the aforementioned treating solution having a polymerization-initiating capacity as well as a reducing capacity to form a polymer having a solubility or swelling property for various solvents and/or an adhesion to the substrate which are different from those of the unpolymerized polymerizable material. Therefore, according to one embodiment of the present invention, by (1) treating the image-wise light-exposed layer of the silver halide photographic emulsion of a first unit with the treating solution having a reducing capacity, (2) transferring the treating solution to and diffusing the treating solution into the polymerizable material layer of a second unit from the first unit to polymerize the polymerizable material layer selectively in its portions corresponding to the light-unexposed portions of the silver halide emulsion layer in which the treating solution remains unreacted through the step (1), thereby providing image-wise polymerized portions and unpolymerized portions, and (3) removing the unpolymerized portions, for example, by means of a suitable solvent, there is obtained a desired polymeric image.

The kind of solvent suitable for the removal of the abovementioned unpolymerized portions varies depending on the kind of polymerizable material. Usually, the suitable solvent may be chosen from an aqueous solution of a surface active agent (e.g. nonionics and anionics), an aqueous solution of an alkali (e.g. NaOh, KOH, NH$_4$OH, Na$_2$CO$_3$, Na$_2$B$_2$O$_7$ and triethanolamine), an acetic acid ester (e.g. ethyl acetate), a halogenated hydrocarbon (e.g. trichloroethanes and tetrachloroethane) and the like. Suitable solvents for the removal of the unpolymerized portions are those capable of dissolving the unpolymerized polymerizable material but incapable or hardly capable of dissolving the polymerized material. As to a method of dissolution-removing the unpolymerized polymerizable material, there may be employed a method in which a suitable solvent is applied to the polymeric image forming material layer by dipping or spraying to effect removal of the unpolymerized portions therefrom or by a method in which the unpolymerized portions are scrubbed away by means of a sponge or a brush soaked with a suitable solvent. In the case where there is caused such a change in property as a change in phase (from paste to solid) or a considerable change in softening point of the material as between the unpolymerized material and the polymerized material, the removal of the unpolymerized material may be effected by a mechanical means.

Alternatively, as described before, according to another embodiment of the present invention, there may be used an image forming photosensitive element comprising a sheet support and, superimposed on the sheet support in the following order, a layer of an addition-polymerizable material and a layer of a silver halide photographic emulsion. When such an image forming photosensitive element is employed, there can be obtained an image by a series of steps: image-wise light-exposure of the silver halide emulsion layer, treatment of the image-wise light-exposed silver halide layer with a treating solution having a reducing capacity and removal of the unpolymerized portions which correspond to exposure, development and fixation, respectively, in the image formation utilizing the conventional silver salt type photographic material.

In the present invention, if the imaged structure or element is so devised that the surface of the sheet support at its portions exposed by the removal of the unpolymerized material is hydrphilic while the surfaces of the image-wise polymerized portions are hydrophobic and lipophilic, the imaged structure or element is advantageously used as a lithographic printing plate. As examples of the sheet support suitable for this purpose, there can be mentioned a sheet of a metal such as aluminum or zinc and a composite laminate sheet composed of an aluminum sheet or foil and a paper or a film of synthetic resin such as a polyester or a polypropylene. When a film of synthetic resin as such is used as the support, it is necessary to impart to the synthetic resin film a hydrophilic property because the synthetic resin films, in general, are hydrophobic and oleophilic. In order to render the synthetic resin film hydrophilic, for example, a water-soluble polymer such as polyvinyl alcohol or gelatin is applied onto the synthetic resin film and hardened with a hardening agent such as an aldehyde compound, e.g. formaldehyde or acetaldehyde, a phenolic resin, or Na$_2$B$_2$O$_7$ to form thereon a hardened coat of the polymer.

With respect to the addition-polymerizable compound contained in the layer of the polymerizable material, most of the aforementioned compounds other than those having free carboxyl group in large proportion in the molecule (e.g. acrylic acid and methacrylic acid)

and those having amide group or substituted amide group in large proportion in the molecule (e.g. acrylamide and methacrylamide and their derivatives), generally, are polymerized to produce cured polymers having an oleophilic property that is useful for the production of a lithographic printing plate. For the production of a lithographic printing plates, the incorporation of hydrophilic polymers such as polyvinyl alcohol, polyacrylic acid, polymethacrylic acid, polyacrylamide and the like, though they are mentioned before as examples of the binder generally usable in the present invention, into the polymerizable material is not preferred because they cause the hydrophobic and oleophilic property of the polymerized material containing the same to be decreased.

Further, it should be noted that from a viewpoint of the desired hydrophobic and oleophilic property, it is not advantageous for the silver halide emulsion layer on the polymerized portions to be left as it is. Therefore, it is desirable to remove said emulsion layer from the surface of the polymerized portions simultaneously with the removal of the unpolymerized portions. The emulsion layer may be removed, for example, by using the same solvent as used for the removal of the unpolymerized portions of the polymerizable material layer.

The thus formed image of the lithographic printing plate is of a polymer having a sufficient toughness and, hence, even without being subjected to a post-treatment such as lacquer finishing, the lithographic printing plate having the polymeric image obtained by the present invention excellently performs like the conventional PS plates (presensitized plates). Further, in forming the polymeric image for a lithographic printing plate, according to the process of the present invention, the high sensitivity of the silver halide emulsion layer enables the exposure to light to be effected by photographing by means of a camera. Therefore, for forming an image according to the present invention, it is not necessary to employ a source of high intensity ultraviolet rays as different from the case where a PS plate is printed. Furthermore, when the process of the present invention is applied to the production of a lithographic printing plate, the polymeric image of the lithographic printing plate can be simply prepared by direct photographing of a manuscript or a block copy, not via any negative or positive film, leading to such a great advantage that the number of steps of processing is largely reduced.

On the other hand, the polymeric image produced by the process of the present invention can be used as a photographic picture since, as described before, the polymeric image can be provided in the form of a colored image. With respect to the polymeric image produced according to the process of the present invention, the amount of silver in the emulsion layer has no relation to the density of image. Accordingly, even in the case where a high density or contrast of image is desired as in the case of a lith film, such a high density of image can be obtained irrespective of the amount of silver.

As described, according to the present invention, not only can there be obtained polymeric images having various desired characteristics of mechanical strengths, chemicals resistance, thermal properties and electrical properties imparted thereto irrespective of the properties of the photosensitive silver halide emulsion layer, but also the process of the present invention enjoys a high photosensitivity because there is used a silver halide emulsion layer as the photosensitive layer.

The following examples are given to illustrate the present invention in more detail, but should not be construed as limiting the scope of the invention. The claimed process is capable of wide variation and modificaton and, therefore, any minor departure therefrom or extension thereof is considered as being within the skill of the artisan and as falling within the scope of this invention.

Example 1

(1) Provision of a layer of a polymerizable material composition 30 g of acrylic acid, 30 g of butyl acrylate, 30 g of acrylonitrile and 10 g of styrene and 3 g of N,N'-bisisobutyronitrile as a polymerization catalyst were dissolved in 200 g of isopropyl alcohol and the resulting solution was heated at 80° C. for 5.5 hours to obtain a solution of a polymer in isopropyl alcohol (the intrinsic viscosity of the polymer: 0.188 dl/g as measured using methyl ethyl ketone as a solvent at 25° C.).

Then, 30 g of glycidyl methacrylate and 3.15 g of a 40 weight % methanol solution of trimethylbenzyl ammonium hydroxide as a catalyst were added to the polymer solution and the reaction between glycidyl methacrylate and the polymer was effected at 80° C. for 5 hours to obtain a solution of a glycidyl methacrylate-modified polymer. The ratio of the carboxyl groups modified with glycidyl methacrylate relatively to all the carboxyl groups of the polymer was 68%.

35 g of pentaerythritol tetramethacrylate, 300 g of isopropyl alcohol and 300 g of ethyl acetate were added to the solution of the glycidyl methacrylate-modified polymer to prepare a solution of a polymerizable material composition.

The solution of the polymerizable material composition was coated by using a bar coater on a 0.3 mm-thick aluminum plate, the surface of which had been grained using a graining machine, well washed with water and dried. After drying, the thickness of the layer of the polymerizable material composition provided on the aluminum plate was $5\mu$.

(2) Preparation of a treating solution having a reducing capacity

Water was added to 25 g of hydroquinone and 30 g of sodium formaldehyde-bisulfite to prepare 1 liter of a solution. The pH value of the solution was adjusted to 11 with sodium hydroxide to obtain a treating solution.

(3) Confirmation of the function of the treating solution as a polymerization initiator The treating solution prepared in (2) above was dropwise dropped by using a dropping pipette on the layer of the polymerizable material composition provided on the aluminum plate in (1) above and the resulting layer was allowed to stand at room temperature for 5 minutes. Thereafter, the surface of the layer was scrubbed with a sponge soaked with a remover composed of 1 g of sodium phosphate, 10 g of methanol and 100 g of water. The portion of the layer on which the treating solution had been dropped remained unremoved on the aluminum plate, while the other portion of the layer was removed from the aluminum plate. Thus, it was confirmed that the treating solution had a polymerization-initiating capacity.

0.3 g of silver chloride was added to 10 ml of the treating solution and the resulting mixture was stirred for 5 minutes. By using the reaction mixture, substantially the same procedures as described above were repeated with another layer of the polymerizable material composition as provided on an aluminum plate in the same manner as in (1) above. The layer of the composition was all removed from the aluminum plate. Thus, it was confirmed that the polymerization reaction did not occur.

(4) Formation of a polymeric image

A manuscript produced by using a phototype setting machine was photographed on a commercially available lith film having an orthochromatic sensitivity by using a camera for the production of printing plates. The lith film was dipped for 10 seconds in the treating solution prepared in (2) above and contained in a tray under a red safe light. After the lith film was picked up from the tray, the film was allowed to stand for 15 seconds.

Subsequently, the resulting lith film was closely contacted with a layer of the polymerizable material composition provided on an aluminum plate in the same manner as in (1) above to obtain a laminated structure, which was then allowed to stand for 5 minutes. By that time, the portions of the lith film corresponding to the portions of the manuscript having no image were sufficiently blackened, while the portions of the lith film corresponding to the portions of the manuscript having an image were not blackened yet. The lith film was peeled off from the composition layer. The composition layer was scrubbed with a sponge soaked with the same remover as used in (3) above. Only the portions of the composition layer corresponding to the portions of the manuscript having the image remained unremoved on the aluminum plate.

The resulting aluminum plate having a polymeric image thereon was such that it could be used as a printing plate for offset printing. The surface of the plate was gummed with a gum arabic solution. Using the thus treated plate mounted on a sheet-fed offset lithographic printing machine, printing was carried out on paper to obtain clear prints. Even after printing of fifty thousands pieces of the paper, no substantial damage on the polymeric image was caused so that the printing with that printing plate could further be continued.

EXAMPLE 2

Water was added to 25 g of hydroquinone, 30 g of sodium sulfite, 20 g of formalin containing 35 weight % of HCHO and 1.5 of potassium bromide to prepare 1 liter of a treating solution having a reducing capacity.

Substantially the same procedures as in Example 1 except that the treating solution prepared just above was used instead of the treating solution prepared in Example 1 were repeated to produce an aluminum plate having a very excellent polymeric image thereon. The properties as a printing plate of the aluminum plate thus produced were excellent like the one produced in Example 1.

EXAMPLE 3

Two kinds of solutions A and B having the respective following recipes were prepared.

| Solution A | | |
|---|---|---|
| | Component | Amount |
| | Distilled water | 100 ml |
| | Gelatin | 3.5 g |
| | KBr | 15.5 g |
| | KCl | 15.5 g |
| | KI (10 weight % solution) | 8.0 ml |
| Solution B | | |
| | Distilled water | 350 ml |
| | AgNO$_3$ | 37.5 g |
| | Erythrosine | 0.15 g |
| | Gelatin | 55 g |

The solution B was slowly added with stirring to the solution A heated up to 70° C. and the resulting mixture was allowed to stand for 1 hour, followed by coagulation by cooling. The resulting jelly-like mixture was washed with 5° C.-cold water. Subsequently, to the mixture heated up to 55° C. were added an aqueous solution of 20 g of gelatin dissolved in 80 ml of water and 2 ml of a 1 weight % aqueous solution of MgBr$_2$. To 200 g of the resulting mixture were added 20 g of a 5 weight % aqueous solution of formaldehyde to prepare a silver halide photographic emulsion.

The silver halide emulsion thus prepared was coated on a layer of the polymerizable material composition provided on an aluminum plate in the same manner as in Example 1, followed by drying, to prepare a photosensitive element. The thickness of the silver halide photographic layer formed on the layer of the polymerizable material composition was 7μ. The silver halide emulsion layer of the photosensitive element was imagewise exposed in substantially the same manner as in Example 1 to effect photographing.

A filter paper soaked with the treating solution prepared in Example 2 was placed in close contact with the silver halide emulsion layer of the element and allowed to stand in the state of close contact for 5 minutes. Subsequently, the filter paper was removed from the silver halide emulsion layer, which was then scrubbed with a sponge soaked with the same remover as used in Example 1 to effect washing-out. All of the silver halide emulsion layer and the portions of the composition layer corresponding to the blackened portions of the silver halide emulsion layer (corresponding to the portions of the manuscript having no image) were removed from the aluminum plate. Only the portions of the composition layer corresponding to the portions of the manuscript having an image remained unremoved on the aluminum plate, thus substantiating the selective polymerization of said portions to produce a polymeric image on the aluminum plate. The aluminum plate having said polymeric image could be used as an offset lithographic printing plate like the ones produced in Examples 1 and 2.

EXAMPLE 4

30 g of a 50 weight % toluene solution of pentaerythritol tetramethacrylate, 5 g of 2-hydroxyethylmethacrylate, 40 g of cellulose acetate butyrate, 5 g of ethyl cellulose, 20 g of carbon black (particle size: 25–30μ) and 400 g of methyl ethyl ketone were charged into and milled in a glass ball mill for 3 hours to prepare a dispersion of a black polymerizable material composition. The dispersion of the polymerizable material composition was coated by using a bar coater on a matte surface of a polyester film which had been matte-finished by using a sandblaster, and dried to provide on the polyester film a 7μ-thick layer of the polymerizable material composition.

A clean proof produced by using a letterpress proofreading machine was photographed as a manuscript on a lith film having an orthochromatic sensitivity as used for the production of printing plates. The lith film was dipped for 15 seconds in the same treating solution as used in example 2 and contained in a tray. After the lith film was picked up from the tray, the film was allowed to stand for about 30 seconds. The photographic emulsion layer of the lith film was placed in close contact with the layer of the black polymerizable material composition and allowed to stand in the state of close contact for 5 minutes. After removal of the lith film from the composition layer, the composition layer was scrubbed with a sponge soaked with ethyl alcohol. The portions of the composition layer corresponding to the portions of the manuscript having an image remained unremoved on the aluminum plate. Thus, the polymeric image of the composition layer stood in a positive relationship to the image of the manuscript. The black polymeric image had an optical density of more than 2 so that the polyester film having the black polymeric image thereon could be used as an original film for use in the positive printing of the image for the production of a presensitized plate.

EXAMPLE 5

A solution of a polymerizable material composition composed of 75 g of an alcohol-soluble polyamide copolymer, 10 g of N,N'-methylene-bis-acrylamide, 10 g of magnesium acrylate and 250 g of methanol was coated on an aluminum surface of a laminated film and dried to obtain a structure made of the laminated film and an 8μ-thick layer of the polymerizable material composition formed thereon.

The alcohol-soluble polyamide copolymer was one prepared from 35 parts by weight of hexamethylenediammonium adipate, 35 parts by weight of p,p'-diammoniumdicyclohexylmethane adipate and 30 parts by weight of ε-caprolactam.

The laminated film was made of a 50μ-thick aluminum sheet and a 100μ-thick polyethylene terephthalate film laminated thereonto, the surface of the aluminum sheet being matte-finished with a brush.

Using the structure, substantially the same procedures as in Example 2 except that isopropyl alcohol was used as a remover were repeated to produce an offset lithographic printing plate, the properties of which were excellent like the ones produced in Examples 1 and 2.

EXAMPLE 6

A treating solution having a reducing capacity was prepared in the same manner as in Example 1 except that 35 g of L-ascorbic acid was used instead of 25 g of hydroquinone.

Substantially the same procedures as in Example 1 except that the treating solution prepared just above was used instead of the treating solution prepared in Example 1 were repeated to produce an aluminum plate having a very excellent polymeric image thereon. The properties as a printing plate of the aluminum plate thus produced were excellent like the one produced in Example 1.

EXAMPLE 7

A treating solution having a reducing capacity was prepared in the same manner as in Example 2 except that 25 g of 2,4-diaminophenol dihydrochloride was used instead of 25 g of hydroquinone.

Substantially the same procedures as in Example 1 except that the treating solution prepared just above was used instead of the treating solution prepared in Example 1 were repeated to produce an aluminum plate having a very excellent polymeric image thereon. The properties as a printing plate of the aluminum plate thus produced were excellent like the one produced in Example 1.

What is claimed is:

1. A process for producing a polymeric image by selectively polymerizing a layer of an addition-polymerizable material comprising at least one addition-polymerizable unsaturated compound only in predetermined portions of the layer to provide polymerized portions and unpolymerized portions and removing the unpolymerized portions of the layer, which process comprises the steps of:
    (1) treating an image-wise light-exposed layer of a photographic silver halide emulsion with a treating solution having a reducing capacity, said treating solution having a capacity for initiating the polymerization of an addition-polymerizable unsaturated compound and a capacity for reducing the silver halide contained in the silver halide emulsion layer into metallic silver and having a property that it loses said capacity for initiating the polymerization of the addition-polymerizable unsaturated compound once it is used for the reduction of the silver halide, wherein said treating solution comprises an aqueous solution containing a developing agent for the photographic silver halide emulsion, an anti-oxidizing agent and an alkali;
    (2) transferring or diffusing said treating solution from the silver halide emulsion layer into a layer of an addition-polymerizable material comprising at least one addition-polymerizable unsaturated compound to polymerize the addition-polymerizable material layer selectively in its portions corresponding to the light-unexposed portions of the silver halide emulsion layer in which the treating solution remains unreacted through the step (1), providing polymerized portions and unpolymerized portions; and
    (3) removing the unpolymerized portions.

2. A process according to claim 1, wherein the developing agent concentration and anti-oxidizing agent concentration of said aqueous solution are 0.1 to 10% by weight and 0.01 to 20% by weight, respectively, and said alkali is used in an amount sufficient for said aqueous solution to have a pH value of 8 or more.

3. A process according to claim 2, wherein said developing agent is a member selected from the group consisting of hydroquinone, 2,4-diaminophenol dihydrochloride, L-ascorbic acid and combinations thereof.

4. A process according to any one of claims 2 to 3, wherein said anti-oxidizing agent and said alkali are derived from a combination of formaldehyde and an alkali metal sulfite.

5. A process according to any one of claims 2 to 3, wherein said anti-oxidizing agent and said alkali are derived from an alkali metal formaldehyde-bisulfite.

6. A process according to claim 2, wherein said treating solution is an aqueous solution containing hydroquinone and an alkali metal formaldehyde-bisulfite and having a pH value of 8 or more.

7. A process according to any one of claims 1 and 2 to 6, wherein said addition-polymerizable material comprises at least 5% by weight of at least one addition-polymerizable unsaturated compound.

8. A process according to any one of claims 1 and 2 to 7, wherein said at least one addition-polymerizable unsaturated compound is a polymer having, in its side chains, carbon-carbon double bonds.

9. A process according to any one of claims 1 and 2 to 8, wherein said image-wise light-exposed layer of the photographic silver halide emulsion is obtained by subjecting to image-wise light exposure a photosensitive element comprising a support, said layer of the addition-polymerizable material formed thereon and a layer of the photographic silver halide emulsion formed thereon, and wherein the transferring or diffusing of said treating solution from the silver halide emulsion layer into the addition-polymerizable material layer is done through the silver halide emulsion layer.

10. A process according to any one of claims 1 and 2 to 8, wherein said image-wise light-exposed layer of the photographic silver halide emulsion and said layer of the addition-polymerizable material are respectively originated from separate first and second units, said first unit comprising a support and a layer of the photographic silver halide emulsion formed thereon and said second unit comprising a support and said layer of the addition-polymerizable material formed thereon, and wherein the transferring or diffusing of said treating solution from the silver halide emulsion layer into the addition-polymerizable material layer is done by contact therebetween.

11. A process according to any one of claims 1 and 2 to 10, wherein the surface of said support bearing thereon said layer of the addition-polymerizable material is hydrophilic and wherein said polymerized portions are oleophilic.

* * * * *